(12) United States Patent
Chin et al.

(10) Patent No.: US 7,052,784 B2
(45) Date of Patent: May 30, 2006

(54) ORGANIC ELECTROLUMINESCENT DEVICE USING A MIXTURE OF HIGH AND LOW MOLECULAR LIGHT-EMITTING SUBSTANCE AS A LIGHT-EMITTING SUBSTANCE

(75) Inventors: Byung Doo Chin, Seongnam (KR); Min Chul Suh, Seongnam (KR); Mu Hyun Kim, Suwon (KR); Seong Taek Lee, Suwon (KR); Jang Hyuk Kwon, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/421,754

(22) Filed: Apr. 24, 2003

(65) Prior Publication Data

US 2004/0001972 A1 Jan. 1, 2004

(30) Foreign Application Priority Data

Jun. 28, 2002 (KR) .............................. 2002-36558

(51) Int. Cl.
*H05B 33/14* (2006.01)
*B32B 9/00* (2006.01)

(52) U.S. Cl. ...................... 428/690; 428/917; 313/504; 313/506

(58) Field of Classification Search ............... 428/690, 428/917, 32.6, 32.77; 313/504, 506
See application file for complete search history.

(56) References Cited

U.S. PATENT DOCUMENTS

| | | | |
|---|---|---|---|
| 5,220,348 A | 6/1993 | D'Aurelio | |
| 5,256,506 A | 10/1993 | Ellis et al. | |
| 5,278,023 A | 1/1994 | Bills et al. | |
| 5,281,489 A * | 1/1994 | Mori et al. | 428/690 |
| 5,308,737 A | 5/1994 | Bills et al. | |
| 5,779,937 A * | 7/1998 | Sano et al. | 252/301.16 |
| 5,807,974 A * | 9/1998 | Kim et al. | 528/366 |
| 5,965,281 A | 10/1999 | Cao | |
| 5,998,085 A | 12/1999 | Isberg et al. | |
| 6,114,088 A | 9/2000 | Wolk et al. | |
| 6,117,567 A | 9/2000 | Andersson et al. | |
| 6,214,520 B1 | 4/2001 | Wolk et al. | |
| 6,451,457 B1 * | 9/2002 | Taguchi | 428/690 |
| 6,593,688 B1 * | 7/2003 | Park et al. | 313/504 |
| 2002/0047567 A1 * | 4/2002 | Fujita et al. | 315/169.3 |
| 2002/0064683 A1 * | 5/2002 | Okada et al. | 428/690 |
| 2002/0081456 A1 * | 6/2002 | Hamada | 428/690 |
| 2002/0146590 A1 * | 10/2002 | Matsuo et al. | 428/690 |
| 2003/0085653 A1 * | 5/2003 | Kim et al. | 313/506 |
| 2004/0137274 A1 * | 7/2004 | Igarashi | 428/690 |
| 2004/0214037 A1 * | 10/2004 | Roberts et al. | 428/690 |
| 2005/0095357 A1 * | 5/2005 | Kim et al. | 427/66 |
| 2005/0095460 A1 * | 5/2005 | Kim et al. | 428/690 |

FOREIGN PATENT DOCUMENTS

| KR | 1998-51814 | 9/1998 |
|---|---|---|
| KR | 2001-03986 | 1/2001 |

* cited by examiner

*Primary Examiner*—Dawn Garrett
(74) *Attorney, Agent, or Firm*—Stein, McEwen & Bui, LLP

(57) ABSTRACT

An organic EL device in which light-emitting efficiency, color purity and laser induced thermal imaging characteristics are improved by providing with an organic EL device comprising a first electrode, a hole transport layer, a light-emitting layer, and a second electrode, wherein the light-emitting layer uses a mixture of an optically active low molecular electric charge transport material and a high molecular light-emitting substance.

13 Claims, 3 Drawing Sheets

ORGANIC ELECTROLUMINESCENT DEVICE USING A MIXTURE OF HIGH AND LOW MOLECULAR LIGHT-EMITTING SUBSTANCE AS A LIGHT-EMITTING SUBSTANCE

CROSS-REFERENCE TO RELATED APPLICATIONS

This application claims the benefit of Korean Application No. 2002-36558, filed Jun. 28, 2002, in the Korean Intellectual Property Office, the disclosure of which is incorporated herein by reference.

BACKGROUND OF THE INVENTION

1. Field of the Invention

The present invention relates to an organic electroluminescent device, and more particularly, to an organic electroluminescent device using a mixture of high and low molecular light-emitting substances as a light-emitting substance so as to enable laser induced thermal imaging (LITI) as a high molecular organic electroluminescent device using a high molecular material emitting light under an electric field.

2. Description of Related Art

Generally, an organic electroluminescent device consists of various layers including an anode and cathode, a hole injection layer, a hole transport layer, a light-emitting layer, and an electron transport layer. The organic electroluminescent device is divided into high and low molecular organic electroluminescent devices depending on a material to be used, wherein each layer is introduced by vacuum deposition in the case of the low molecular organic electroluminescent (hereinafter referred to as EL) device while a light-emitting device is fabricated using a spin coating process, or an ink jet process in the case of the high molecular organic EL device. In the case of a single color device, an organic EL device using a high molecular material is simply fabricated using the spin coating process, wherein the organic EL device using a high molecular material has drawbacks of lower efficiency and life cycle, although it has a lower driving voltage compared to an organic EL device using a low molecular material. Furthermore, red, green and blue color high molecular materials should be patterned when fabricating a full color device, and the organic EL device using high molecular materials has problems in that emitting characteristics such as efficiency and life cycle are deteriorated when using ink jet technology or laser induced thermal imaging.

Particularly, in the case of most materials, a single material is not transferred when patterning the material by using laser induced thermal imaging. A method of forming patterns of an organic EL device by laser induced thermal imaging is disclosed in Korean Patent No. 1998-51814, and U.S. Pat. Nos. 5,998,085, 6,214,520 and 6,114,088.

In order to apply the heat transfer process, a light source, a transfer film and a substrate are needed at the least, and light coming out of the light source is absorbed by a light absorption layer of the transfer film to be converted into heat energy so that a transfer layer forming material of the transfer film is transferred onto the substrate by heat energy to form a desired image, as disclosed in U.S. Pat. Nos. 5,220,348, 5,256,506, 5,278,023 and 5,308,737.

The heat transfer process can be used to fabricate a color filter for liquid crystal display devices, or to form patterns of a light-emitting substance, as disclosed in U.S. Pat. No. 5,998,085. Although it is written in U.S. Pat. No. 5,998,085 that a light-emitting substance for an organic EL device is transferred onto a substrate, characteristics on materials used to improve transfer properties are not mentioned in the patent.

Furthermore, although there are such patents as U.S. Pat. No. 6,117,567 for creating other colors using phase separation of light-emitting substances, Korean Patent No. 2001-3986 for increasing efficiency, or U.S. Pat. No. 5,965,281 for improving device characteristics by adding ionic surfactants, all of the patents are related to improvement of characteristics of materials themselves. Therefore, literature and patents regarding improvement of high molecular materials during patterning using laser induced thermal imaging do not exist currently.

SUMMARY OF THE INVENTION

Accordingly, it is an aspect of the present invention to provide an organic EL device using a mixture of high and low molecular light-emitting substances as a light-emitting substance in which a high molecular light-emitting layer can be patterned, and color purity and light-emitting characteristics are improved when fabricating a full color high molecular organic EL device by laser induced thermal imaging.

Additional aspects and advantages of the invention will be set forth in part in the description which follows and, in part, will be obvious from the description, or may be learned by practice of the invention.

The foregoing and/or other aspects of the present invention are achieved by providing an organic EL device comprising a first electrode, a hole transport layer, a light-emitting layer and a second electrode, wherein the light-emitting layer uses a mixture of an optically active low molecular electric charge transport material and a high molecular light-emitting substance.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
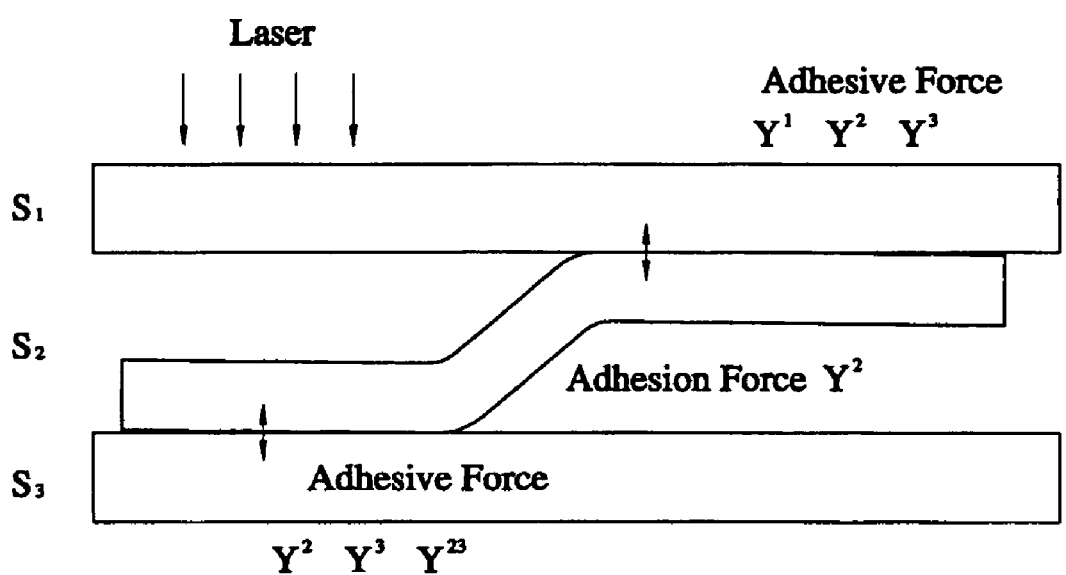
FIG. 1 is a drawing illustrating a transfer mechanism when transfer patterning an organic EL layer used in an organic EL device using a laser.

Reference will now be made in detail to the embodiments of the present invention, examples of which are illustrated in the accompanying drawings, wherein like reference numerals refer to like elements throughout. The embodiments are described below in order to explain the present invention by referring to the figures.

As illustrated in FIG. 1, an organic layer S2, which is adhered onto a substrate S1, must be separated from a part of S1 where the laser is not received as the organic layer S2 is separated from the substrate S1 and transferred to a substrate S3 by action of the laser in a mechanism of transfer patterning of an organic layer using an ordinary laser.

Figure 3:
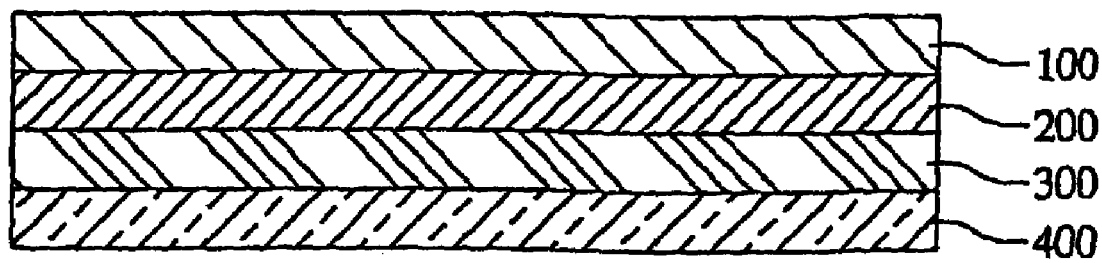
FIG. 3 is a cross-sectional view illustrating an organic EL display device according to the present invention.

FIG. 3 shows a cross-sectional view illustrating an organic EL display device incorporating an organic EL layer according to the present invention. In FIG. 3, reference numerals 100, 200, 300 and 400 denote a cathode, a light-emitting layer, a hole transporting layer, and an anode, respectively.

Factors influencing transfer characteristics are adhesion force (W12) between the substrate S1 and the film S2, adhesive force (W22) between the films, and adhesion force (W23) between the film S2 and the substrate S3. These adhesion and adhesive forces are represented as surface tensions ($\gamma 1, \gamma 2, \gamma 3$) and interfacial tensions ($\gamma 12, \gamma 23$) of each layer as in the following expressions:

$$W12 = \gamma 1 + \gamma 2 - \gamma 12;$$

$$W22 = 2\gamma 2; \text{ and}$$

$$W23 = \gamma 2 + \gamma 3 - \gamma 23.$$

In order to improve laser induced thermal imaging characteristics, the adhesive force between the films should be less than the adhesion force between each substrate and the film. Generally, a high molecular film is used as a light-emitting substance including a light-emitting layer in an organic EL device, wherein the high molecular film may not have good transfer characteristics when patterning using a laser since it has a high adhesive force between films as a material having a high molecular weight.

Therefore, transfer characteristics can be improved either by lowering the adhesive force between the films or by increasing the adhesion force between the film and a substrate.

In the case of a high molecular light-emitting substance including a light-emitting layer of the present invention, it is difficult to manufacture light-emitting layer patterns by laser induced thermal imaging since the adhesive force between high molecular light-emitting substances themselves is very high compared with the adhesion force between the light-emitting substance and a substrate, or the adhesion force between the light-emitting substance and the surface of a donor film on which the light-emitting layer is coated. In order to solve these and other problems, the high molecular material is used together with a low molecular material having a relatively low adhesive force between the films, and a high molecular matrix preventing phase separation between a high molecular material and a low molecular material and helping formation of film is additionally added if it is necessary. A material inhibiting phase separation and functioning as a binder, which are generally used as a high molecular matrix improving coating uniformity of an organic layer, preferably is an optically inert high molecular material selected from a group consisting of polystyrene, poly(4-methylstyrene), poly($\alpha$-methylstyrene), polymethylmetacrylate (PMMA), polyethylmetacrylate, poly(vinyl pyridene), poly(vinyl pyridine), polyphenyleneoxide (PPO), styrene-butadiene block copolymer, styrene-metacrylic acid ester copolymer, styrene-methylmetacrylate copolymer, polycarbonate, polyethyleneterephthalate, polyestersulfonate, polysulfonate, polyacrylate, polyimide fluoride, transparent fluorocarbon resin, and transparent acryl based resin. The high molecular matrix preferably has a weight ratio of 0 more, or 0.9 or less for the total weight of the light-emitting layer. "Optically inert" means that the final light-emitting spectrum and color coordinates in the visible light range (450~800 nm) showing a light-emitting substance are not influenced even though additives are introduced.

On the other hand, all of the materials having a structure including basically used light-emitting high molecular materials such as polyfluorene, polyspiro and poly(vinylene phenylene) can be used as a high molecular light-emitting substance contained in the light-emitting layer. Furthermore, in the case of using a high molecular matrix, generally used low molecular light-emitting substances such as fluorene, phenylene, anthracene, etc., can be further added to the high molecular light-emitting substances as light-emitting substances.

Furthermore, materials that have electric charge transport capabilities and are optically active including a low molecular hole transport material used as a host substance of an electrophosphorescent device, an amorphous hole transport material having a high glass transition temperature and an electron transport material, are used as a low molecular light-emitting substance. "Optically active materials" mean materials showing photoluminescence characteristics having a peak in the range of 350~650 nm. Carbazole based 4,4-N,N'-dicarbazole-biphenyl (CBP; photoluminescence peak, $\lambda$max=377 nm) or arylamine based N,N'-8-bis-1-naphthylyl-diphenyl-1,1'-biphenyl-4,4'-diamine ($\alpha$-NPB; $\lambda$max=433 nm) having hole transport capability is preferably used as a low molecular electric charge transport material. Oxadiazole based material, preferably 2-(4-biphenylyl)-5-(4-tert-butylphenyl)-1,2,4-oxadiazole (PBD; $\lambda$max=439 nm) is used as a material having electron transport capability. Furthermore, starburst amine based 4,4',4''-tri(N-carbazolyl)triphenylamine (TCTA; $\lambda$max=390 nm), 4,4',4''-tris(N-3-methyl phenyl amino)-triphenylamine (m-MTDATA; $\lambda$max=428 nm) and 1,3,5-tris-(N,N-bis-(4-methoxy-phenyl)-aminophenyl)-benzene (TDAPB; $\lambda$max=439 nm) can also be used as a material having electron transport capability.

An amount of low molecular light-emitting substances to be used preferably has a weight ratio of 0.1 or more, or 0.9 or less for the total weight of the light-emitting layer.

The mixing weight ratio of the light-emitting layer can be controlled depending on color purity, efficiency and patterning characteristics of a device. A fabrication method of a high molecular organic EL device according to an embodiment of the present invention is as follows.

The air blow treated substrate passes through a supersonic cleaning process using a neutral detergent, acetone, isopropyl alcohol (IPA), etc., after air blow treating a patterned ITO substrate. A high molecular layer used as a hole injection layer is spin coated on the ITO substrate after removing moisture and an organic material pollution source by treating UV/O$_3$ onto the surface of the cleaned and dried ITO substrate for more than 15 minutes, and then the high molecular layer spin coated on the ITO substrate is baked at a high temperature to remove residual moisture. In the case of fabricating a single color device, the device is completed by encapsulating the deposited layer after spin coating a mixed layer to a thickness of tens of nm and cathode depositing the spin coated mixed layer.

A fabrication method of a light-emitting layer patterned device comprises the processes of laying up a hole injection layer and a transport layer on a substrate by spin coating, transferring a high molecular mixed light-emitting layer spin coated on a donor film to a thickness of tens of nm on ITO patterns by laser induced thermal imaging, cathode depositing the high molecular mixed light-emitting layer transferred ITO patterns, and encapsulating the deposited material, thereby finally completing the device.

An edge roughness of a light-emitting layer of the above-fabricated organic EL device can be maintained to less than 8 μm.

EXAMPLES

The present invention will be explained in more detail with reference to Examples hereinafter.

Examples 1 and 2

A low molecular hole transport material, 4,4'-N,N'-dicarbazole-biphenyl (CBP) manufactured by Universal Display Corporation, was dissolved into toluene in a concentration ranging from 1.0 to 2.0 wt %. As a high molecular matrix, polystyrene having a molecular weight of 50,000 manufactured by POLYSCIENCE CORPORATION and poly(4-methylstyrene) having a molecular weight of 70,000 manufactured by ALDRICH CORPORATION were dissolved into toluene in a concentration ranging from 1.0 to 2.0 wt. % respectively. As a high molecular light-emitting substance, Green K2 manufactured by DOW CHEMICAL CORPORATION, which is a polyfluorene based green light-emitting substance, was dissolved into toluene in a concentration ranging from 1.0 to 2.0 wt. %. The agitated solutions were mixed in an appropriate mixing ratio after completely dissolving each of the solutions by sufficiently agitating each of the solutions at a temperature of 60° C. for more than 3 hours. The mixed solution film was stored in a nitrogen atmosphere after agitating the mixed solution at an ordinary temperature for more than 1 hour, and forming a mixed solution film having a thickness of 50 to 80 nm by spin coating the mixed solution on a transfer donor film in the atmosphere. PEDOT/PSS having a model name of CH8000 manufactured by BAYER AG was spin coated on the UV-$O_3$ treated substrate in the atmosphere to form a hole injection layer after UV-$O_3$ treating the ultrasonic cleaned substrate for 15 minutes after ultrasonic cleaning an anode patterned ITO substrate. A substrate for laser induced thermal imaging was manufactured by spin coating a solution as a hole transport layer and a primary layer that is prepared by dissolving BFE manufactured by DOW CHEMICAL CORPORATION also into toluene in a concentration of 0.4 wt. % to a thickness of 10 to 30 nm on the moisture removed hole injection layer after removing residual moisture in the PEDOT layer by baking the hole injection layer at a high temperature of 100° C. or more for several minutes.

An organic layer coated transfer film was covered on the substrate and thermally transferred onto the substrate by using a laser. A device was fabricated by sequentially depositing 2 nm of LiF and 300 nm of Al as the cathode on the heat treated light-emitting layer and encapsulating the cathode deposited light-emitting layer with a glass substrate after heat treating a patterned light-emitting layer in a nitrogen atmosphere at a temperature of 130° C. for one hour. It is not possible to form patterns using laser induced thermal imaging if only green K2 manufactured by DOW CHEMICAL CORPORATION is used as a raw material. Weight ratio ranges of CBP and polystyrene for the total mixed light-emitting layer in which laser transfer was possible and efficiency was satisfactory were $0.25 \leq CBP \leq 0.5$ and $0 < polystyrene < 0.5$. An edge roughness of the transferred film was 5 to 8 μm. Characteristics of a laser induced thermal imaging organic EL device fabricated using a light-emitting layer in which green K2/CBP/polystyrene and green K2/CBP/poly(4-methylstyrene) were respectively mixed in a weight ratio of 1:1:1 is represented in the following Table 1:

TABLE 1

Structure of device: ITO/PEDOT (60 nm)/BEF (20 nm)/EML (50–90 nm)/LiF (2 nm)/Al (250 nm)

|  | EML | Efficiency (Cd/A) | Driving Voltage (500 Cd/m2) | CIE x | CIE y |
|---|---|---|---|---|---|
| EXAMPLE 1 | Green K2/CBP/ polystyrene (1:1:1) | 8.0 | 4.1 | 0.36 | 0.60 |
| EXAMPLE 2 | Green K2/CBP/ poly(4-methylstyrene) (1:1:1) | 4.2 | 4.7 | 0.36 | 0.60 |

Examples 3,4 and Comparative Examples

In examples 3 and 4, an organic EL device was fabricated by forming a light-emitting layer by spin coating after respectively dissolving green K2, a high molecular material, CBP, polystyrene, poly(4-methylstyrene), etc., into toluene in a concentration ranging from 1.0 to 2.0 wt. % so that they have the same weight fractions as the high molecular light-emitting substances used in the Examples 1 and 2. The mixed solution was used in a spin coating process after agitating each of the solutions prepared by dissolving green K2, a high molecular material, CBP, polystyrene, poly(4-methylstyrene), etc., into toluene at a temperature of 60° C. for more than 3 hours, and mixing each of the agitated solutions to a certain mixing ratio.

PEDOT/PSS having a model name of CH8000 manufactured by BAYER AG was spin coated on the UV-$O_3$ treated substrate in the atmosphere to form a hole injection layer after UV-$O_3$ treating the ultrasonic cleaned substrate for 15 minutes after ultrasonic cleaning an ITO substrate. The mixed solution film was heat treated at a temperature of 130° C. in a nitrogen atmosphere for one hour after removing residual moisture in the PEDOT layer by baking the hole injection layer at a high temperature of 100° C. or more for about several minutes, and forming a mixed solution layer having a thickness of 50 to 80 nm by spin coating a light-emitting layer that is dissolved by toluene on the moisture removed hole injection layer. A device was fabricated by sequentially depositing 2 nm of LiF and 300 nm of Al as the cathode on the light-emitting layer and encapsulating the cathode deposited light-emitting layer with a glass substrate. Characteristics of an organic EL device fabricated by spin coating a light-emitting layer in which green K2/CBP/polystyrene and green K2/CBP/poly(4-methylstyrene) were respectively mixed in a weight ratio of 1:1:1 is represented in the following Table 2. The performance of the organic EL device was compared with that of an organic EL device fabricated by spin coating green K2 of a high molecular material only. An organic EL device using a pure green K2 light-emitting layer can not be patterned by laser induced thermal imaging while an organic EL device, using a mixed light-emitting layer of a low molecular material and polystyrene, can be patterned by laser induced thermal imaging, wherein results of improved efficiency and color coordinates at 500 $Cd/m^2$ are represented in Table 2. Here, a light-emitting layer of green K2/CBP/polystyrene (1:1:1)

had 11.2 Cd/m² (8.5 lm/W) and color coordinates of 0.35 and 0.60, wherein efficiency was 500 Cd/m² at CIE 1931 and 5V.

TABLE 2

Structure of the device: ITO/PEDOT
(60 nm)/EML (50–90 nm)/LiF (2 nm)/Al (250 nm).

|  | EML | Efficiency (Cd/A) at 500 nit | CIE x | CIE y |
|---|---|---|---|---|
| EXAMPLE 3 | Green K2/CBP/polystyrene (1:1:1) | 11.2 | 0.35 | 0.60 |
| EXAMPLE 4 | Green K2/CBP/poly(4-methylstyrene) (1:1:1) | 8.6 | 0.36 | 0.60 |
| COMPARATIVE EXAMPLE | Green K2 | 7.6 | 0.40 | 0.60 |

Examples 5 and 6

Measuring the results of coordinates for a light-emitting diode fabricated by blending a low molecular hole transport material into a high molecular light-emitting substance are shown in the Examples 5 and 6. Each of the solutions were mixed in an appropriate weight ratio and agitated at an ordinary temperature for more than one hour after mixing 4,4'-N,N'-dicarbazole-biphenyl (CBP; manufactured by Universal Display Corporation), a green high molecular light-emitting substance having a brand name of GREEN manufactured by COVION CORPORATION and a blue high molecular light-emitting substance having a brand name BLUE J manufactured by DOW CHEMICAL CORPORATION with toluene in a concentration ranging from 1.0 to 2.0%, and completely dissolving the raw material materials in toluene by sufficiently agitating the mixture in toluene at a temperature of 60° C. for more than 3 hours. An organic EL device was fabricated by forming a light-emitting layer also in a spin coating process. As in the Examples 3 and 4, PEDOT/PSS having a model name of CH8000 manufactured by BAYER AG was spin coated on the UV-O₃ treated substrate in the atmosphere to form a hole injection layer after UV-O₃ treating the ultrasonic cleaned substrate for 15 minutes after ultrasonic cleaning an ITO substrate. A mixed solution layer was formed by spin coating a light-emitting layer that is dissolved by toluene on the moisture removed hole injection layer after removing residual moisture in the PEDOT layer by baking the hole injection layer at a high temperature of 100° C. or more for about 5 minutes. A device was fabricated by sequentially depositing 2 nm of LiF and 300 nm of Al as the cathode on the light-emitting layer and encapsulating the cathode deposited light-emitting layer with a glass substrate.

Characteristics of an organic EL device fabricated by spin coating a light-emitting layer, in which GREEN manufactured by COVION CORPORATION that is a polyvinyl phenylene based green light-emitting high molecular material/CBP and BLUE J manufactured by DOW CHEMICAL CORPORATION that is polyfluorene blue high molecular material/CBP were respectively mixed in a weight ratio of 1:3, are represented in the following Table 3. Improved effects of color coordinates according to the present invention could be confirmed since CIE color coordinates were (0.35, 0.59) and (0.15, 0.19) respectively in the case of fabricating an organic EL device by spin coating using high molecular materials such as GREEN manufactured by COVION CORPORATION and BLUE J manufactured by DOW CHEMICAL CORPORATION only. In the case of mixed material compositions of the Examples 5 and 6, an edge roughness of less than 8 μm was possible by laser induced thermal imaging.

TABLE 3

Structure of the device: ITO/PEDOT
(60 nm)/EML (50–90 nm)/LiF (2 nm)/Al (250 nm)

|  | EML | Efficiency (Cd/A) | CIE x | CIE y |
|---|---|---|---|---|
| EXAMPLE 5 | Green manufactured by Covion Corporation/CBP (1:3) | 3.10 (500 nit) | 0.27 | 0.59 |
| EXAMPLE 6 | Blue J/CBP (1:3) | 1.62 (150 nit) | 0.15 | 0.14 |

Figure 2:
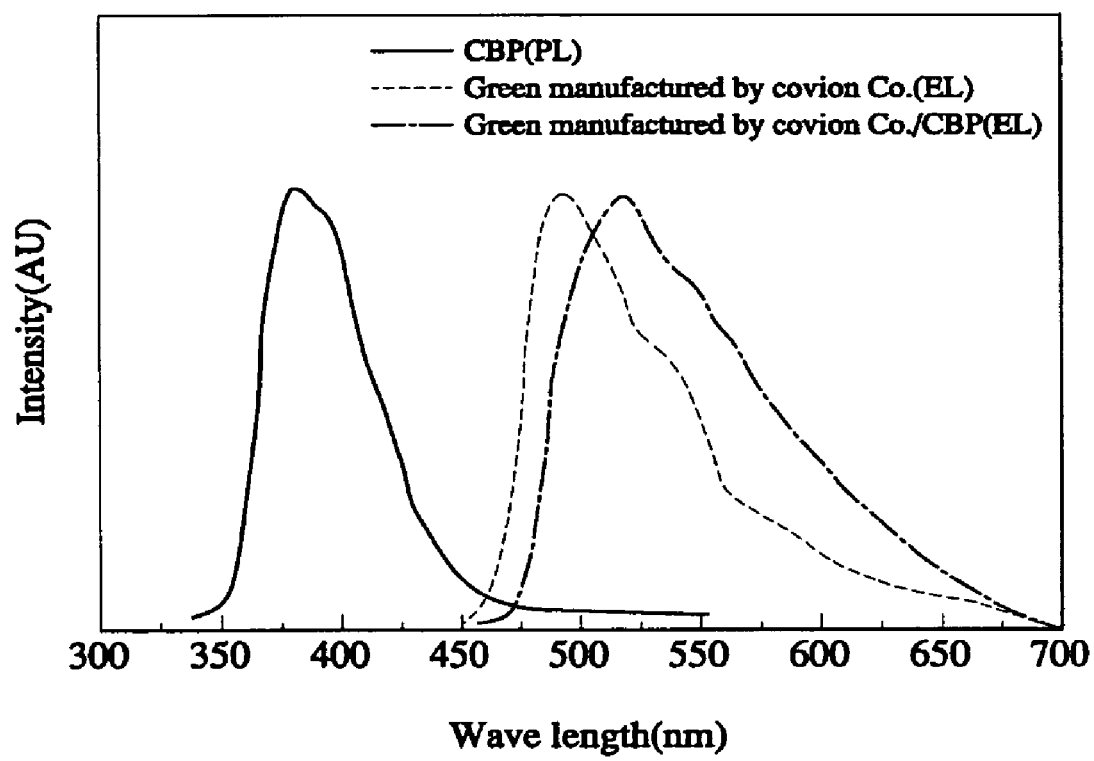
FIG. 2 is a graph illustrating color purity improvement results of a green light-emitting substance as a spectrum of photoluminescence and electroluminescence of a low molecular material (CBP), a light-emitting high molecular material and a mixture thereof.

It can be seen that a color purity of the mixture of a low molecular charge transport material and a green light-emitting high molecular material was improved from FIG. 2, which are photoluminescence and electroluminescence spectrums of a low molecular material (CBP), a green light-emitting high molecular material (Green of Covion Corporation), and a mixture thereof (Example 5).

As described above, a mixed light-emitting layer was fabricated in the present invention in which the amount of an optically inert polymer was reduced or removed by adding a low molecular hole transport material widely used as a host substance of a phosphorescent device to a high molecular light-emitting substance. Accordingly, laser induced thermal imaging characteristics were superior by having an edge roughness of 5 to 8 μm, and 50% or more of efficiency improvement could be obtained having an efficiency of 11.2 Cd/A (7.6 Cd/A in the case of a pure high molecular material) under the same luminescence condition (500 Cd/m²). Color purities of green and blue devices were improved by variation of a light-emitting spectrum due to mixing of the low molecular material that is optically active.

Although a few embodiments of the present invention have been shown and described, it would be appreciated by those skilled in the art that changes may be made in this embodiment without departing from the principles and spirit of the invention, the scope of which is defined in the claims and their equivalents.

The invention claimed is:

1. An organic EL device, comprising:
   a first electrode which is a cathode encapsulated with a glass substrate;
   a hole transport layer;
   a light-emitting layer; and
   a second electrode;
   wherein the light-emitting layer uses a mixture of an optically active low molecular electric charge transport material and a high molecular light-emitting substance, and the light-emitting layer is patterned to an edge roughness of 5 to 8 microns.

2. An organic EL device comprising:
   a first electrode;
   a hole transport layer;
   a light-emitting layer; and
   a second electrode;
   wherein the light-emitting layer uses a mixture of an optically active low molecular electric charge transport material and a high molecular light-emitting substance,
   wherein the light-emitting layer is patterned to an edge roughness of 8 microns or less.

3. The organic EL device according to claim 2, wherein the low molecular electric charge transport material is one of: carbazole, aryl amine, starburst and oxadiazole.

4. The organic EL device according to claim 3, wherein the carbazole based material is 4-4'-N-N'-dicarbazole-biphenyl (CBP).

5. The organic EL device according to claim 3, wherein the aryl amine based material is N,N'-bis-1-naphthyl-diphenyl-1,1'-biphenyl-4,4'-diamine ($\alpha$-NPB).

6. The organic EL device according to claim 3, wherein the starburst based material is a material selected from the group consisting of 4,4',4"-tri(N-carbazole)-triphenylamine (TCTA), 4,4',4"-tris(N-3-methyl phenyl amino)-triphenylamine (m- MTDATA), and 1,3,5-tris(N,N-bis-(4-methoxyphenyl-aminophenyl)-benzene (TDAPB).

7. The organic EL device according to claim 3, wherein the oxadiazole based material is 2-(4-biphenyl)-5-(4-tert-butylphenyl)-1,2,4-oxadiazole.

8. The organic EL device according to claim 2, wherein a weight ratio of a weight of the low molecular electric charge transport material to a total weight of the light-emitting layer is in a range of 0.1 to 0.9.

9. The organic EL device according to claim 2, wherein the high molecular light-emitting substance is a material selected from polyfluorene (PFO), polyspiro and PPV (poly phenylene vinylene).

10. The organic EL device according to claim 2, wherein the light-emitting layer further comprises a high molecular matrix.

11. The organic EL device according to claim 10, wherein the high molecular matrix is an optically inert high molecular material selected from a group consisting of polystyrene, poly(4-methylstyrene), poly($\alpha$-methyl styrene), polymethylmetacrylate (PMMA), polyethylmetacrylate, poly(vinyl pyridine), polyphenyleneoxide (PPO), styrene-butadiene block copolymer, styrene-metacrylic acid ester copolymer, styrene-methylmetacrylate copolymer, polycarbonate, polyethyleneterephthalate, polyestersulfonate, polysulfonate, polyacrylate, polyimide fluoride, transparent fluorocarbon resin, and transparent acryl based resin.

12. The organic EL device according to claim 10, wherein a weight ratio of a weight of the low molecular electric charge transport material to a total weight of the light-emitting layer is in a range of 0.1 to 0.9.

13. The organic EL device according to claim 2, wherein the organic EL device further comprises one material selected from the group consisting of fluorene, phenylene, and anthracene low molecular light-emitting substances.

* * * * *

UNITED STATES PATENT AND TRADEMARK OFFICE
CERTIFICATE OF CORRECTION

| | | |
|---|---|---|
| PATENT NO. | : 7,052,784 B2 | Page 1 of 1 |
| APPLICATION NO. | : 10/421754 | |
| DATED | : May 30, 2006 | |
| INVENTOR(S) | : Byung Doo Chin et al. | |

It is certified that error appears in the above-identified patent and that said Letters Patent is hereby corrected as shown below:

Title Page, Item (54) and Column 1, Line 1, change "SUBSTANCE" to --SUBSTANCES--, first occurrence.

Signed and Sealed this

Seventh Day of November, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,052,784 B2 |
| APPLICATION NO. | : 10/421754 |
| DATED | : May 30, 2006 |
| INVENTOR(S) | : Byung Doo Chin et al. |

It is certified that error appears in the above-identified patent and that said Letters Patent is hereby corrected as shown below:

Title Page, Item (73) Assignee, change "Samsung Electronics Co., Ltd." to --Samsung SDI Co., Ltd.--.

Signed and Sealed this

First Day of May, 2007

JON W. DUDAS
*Director of the United States Patent and Trademark Office*